United States Patent [19]

Bulat et al.

[11] Patent Number: 5,369,294
[45] Date of Patent: Nov. 29, 1994

[54] FIELD EFFECT TRANSISTOR AND METHOD OF FABRICATING

[75] Inventors: Emel S. Bulat, Framingham; Charles Herrick, Reading, both of Mass.

[73] Assignee: GTE Laboratories Incorporated, Waltham, Mass.

[21] Appl. No.: 999,473

[22] Filed: Dec. 30, 1992

Related U.S. Application Data

[62] Division of Ser. No. 821,518, Jan. 15, 1992, Pat. No. 5,192,696.

[51] Int. Cl.$^5$ ............... H01L 27/01; H01L 29/00; H01L 29/78
[52] U.S. Cl. ................... 257/264; 257/263; 257/269; 257/270
[58] Field of Search ............... 257/264, 269, 270, 287, 257/263

[56] References Cited

U.S. PATENT DOCUMENTS

| | | | |
|---|---|---|---|
| 4,223,328 | 9/1980 | Terasawa et al. | 257/264 |
| 4,477,963 | 10/1984 | Cogan | 29/571 |
| 4,551,909 | 11/1985 | Cogan et al. | 257/264 |
| 4,611,384 | 9/1986 | Bencuya et al. | |
| 4,751,556 | 6/1988 | Cogan et al. | 257/264 |
| 4,983,536 | 1/1991 | Bulat et al. | |
| 5,013,674 | 5/1991 | Bergemont | |
| 5,066,603 | 11/1991 | Bulat et al. | |

FOREIGN PATENT DOCUMENTS 53-75778  7/1978  Japan ................... 257/256

Primary Examiner—Andrew J. James
Assistant Examiner—Stephen D. Meier
Attorney, Agent, or Firm—Victor F. Lohmann, III

[57] ABSTRACT

A junction field effect transistor, specifically a static induction transistor. The N-type source regions are formed as two zones. First, relatively lightly doped first zones are formed by ion-implanting doping material relatively deeply into the semiconductor material. Then relatively heavily doped second zones are formed by ion-implanting doping material to a relatively shallow depth within the first zones to leave portions of the first zones interposed between the second zones and the remainder of the semiconductor material. The resulting devices exhibit reduced gate-drain junction capacitance at low drain bias voltages thereby improving device capacitance linearity.

3 Claims, 3 Drawing Sheets

FIELD EFFECT TRANSISTOR AND METHOD OF FABRICATING

This invention was made with Government support under Contract No. F33615-89-C-1115 awarded by the Department of the Air Force. The Government has certain rights in this invention.

This is a divisional of copending application(s) Ser. No. 07/821,518 filed on Jan. 15, 1992, now U.S. Pat. No. 5,192,696.

BACKGROUND OF THE INVENTION

This invention relates to semiconductor devices. More particularly, it is concerned with junction field effect transistors of static induction type and to methods of fabricating. The static induction transistor is a field effect semiconductor device capable of operation at relatively high frequency and power. The transistors are characterized by a short, high resistivity semiconductor channel region which may be controllably depleted of carriers. The current-voltage characteristics of the static induction transistor are generally similar to those of a vacuum tube triode.

The static induction transistor generally uses vertical geometry with source and drain electrodes placed on opposite sides of a thin, high resistivity layer of silicon of one conductivity type. Gate regions of the opposite conductivity type are positioned in the high resistivity layer on opposite sides of the source. During operation a reverse bias is applied between the gate regions and the remainder of the high resistivity layer causing a depletion region to extend into the channel region below the source. As the magnitude of the reverse bias is varied, the source-drain current and voltage derived from the attached energy source will also vary.

SUMMARY OF THE INVENTION

The method in accordance with the present invention for producing an improved field effect transistor comprises providing a body of semiconductor material which includes a substrate of semiconductor material of one conductivity type of relatively low resistivity and a layer of semiconductor material of the one conductivity type of relatively high resistivity contiguous with the substrate. The layer has a surface at a surface of the body. A layer of adherent, nonconductive, protective material is formed adherent at the surface with openings therein exposing alternating source surface areas and gate surface areas. Conductivity type imparting material of the opposite conductivity type is introduced into the layer of semiconductor material of the one conductivity type of relatively high resistivity from the gate surface areas to produce gate regions of the opposite conductivity type in the layer of semiconductor material of the one conductivity type of relatively high resistivity at the gate surface areas. Conductivity type imparting material of the one conductivity type is introduced into the layer of semiconductor material of the one conductivity type of relatively high resistivity from the source surface areas to produce first zones of the one conductivity of lower resistivity in the layer of semiconductor material of the one conductivity type of relatively high resistivity at the source surface areas. Then, conductivity type imparting material of the one conductivity type is introduced into the first zones from the source surface areas to produce second zones of the one conductivity type of lower resistivity than the first zones within the first zones while leaving portions of the first zones interposed between the second zones and the layer of semiconductor material of the one conductivity type of relatively high resistivity. The first and second zones form source regions at the source surface areas. Conductive material is then applied to form source and gate contacts in ohmic contact with the second zones of the source regions and with the gate regions, respectively.

An improved field effect transistor in accordance with another aspect of the invention comprises a body of semiconductor material including a substrate of semiconductor material of one conductivity type of relatively low resistivity and a layer of semiconductor material of the one conductivity type of relatively high resistivity contiguous with the substrate. The layer of semiconductor material has a surface at a surface of the body. A layer of adherent, nonconductive, protective material is adherent at the surface and has openings therein defining alternating source surface areas and gate surface areas. A gate region of the opposite conductivity type is inset in the layer of semiconductor material of the one conductivity type of relatively high resistivity at each of the gate surface areas. A source region of the one conductivity type is inset in the layer of semiconductor material of the one conductivity type of relatively high resistivity at each of the source surface areas. Each of the source regions includes a first zone of the one conductivity type of lower resistivity inset in the layer of semiconductor material of the one conductivity type of relatively high resistivity and also a second zone of the one conductivity type of lower resistivity than the first zone inset in the first zone leaving a portion of the first zone interposed between the second zone and the semiconductor material of the layer of semiconductor material of the one conductivity type of relatively high resistivity. A gate contact member is in ohmic contact with each of the gate regions at the gate surface areas. A source contact member is an ohmic contact with the second zone of each of the source regions at the source surface areas. A drain contact member is an ohmic contact with the semiconductor material of the substrate.

In the figures the various elements are not drawn to scale. Certain dimensions are exaggerated in relation to other dimensions in order to present a clearer understanding of the invention.

For a better understanding of the present invention, together with other and further objects, advantages, and capabilities thereof, reference is made to the following description and appended claims in connection with the above-described drawings.

DETAILED DESCRIPTION

In fabricating junction field effect transistors of the static induction type in accordance with the present invention as illustrated in the figures, a substrate of single crystal silicon of one conductivity type is provided as a supporting structure. As is well understood, the substrate is usually a slice or wafer of relatively large surface area. For purposes of illustration, however, the fabrication of only a portion of a single static induction transistor in a fragment of a slice will be shown and described.

Figure 1:
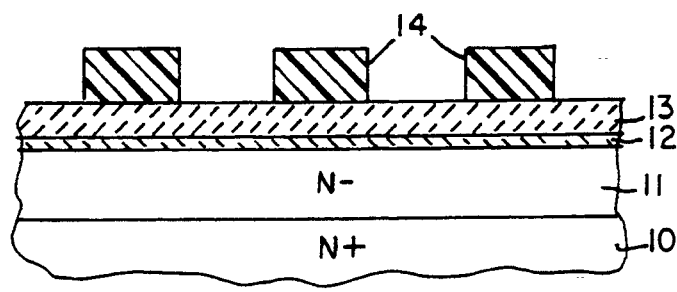
FIGS. 1–7 are a series of elevational views in cross-section of a fragment of a wafer of silicon illustrating successive stages in the fabrication of a junction field effect transistor of the static induction type in accordance with the present invention.

A slice or wafer of N-type silicon of uniform, relatively low resistivity having flat, planar, parallel, opposed major surfaces, a fragment 10 of which is shown in FIG. 1, is produced by any of the known techniques of crystal fabrication including appropriate slicing and cleaning operations. An epitaxial layer 11 of relatively high resistivity N-type conductivity which is precisely controlled as to thickness and as to resistivity and which is a continuation of the crystalline structure of the single crystal substrate 10 is then grown on the surface of the substrate. The upper surface of the epitaxial layer 11 is parallel to the interface between the substrate and the layer.

Figure 2:
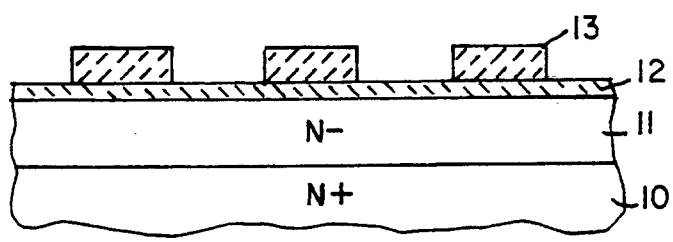

A thin layer of silicon oxide 12 is grown on the surface of the epitaxial layer 11 and a layer of silicon nitride 13 is deposited on the silicon oxide layer. The silicon nitride layer 13 is then covered with a layer of photoresist material 14. By employing known photolithographic techniques portions of the photoresist layer 14 are removed to expose the surface of the silicon nitride layer 13 in a pattern which serves to define the pattern of the elongated parallel source and gate regions of the device. The exposed silicon nitride layer 13 is etched away by employing known plasma etching techniques, and then the remaining photoresist material 14 is removed (FIG. 2).

Figure 3:
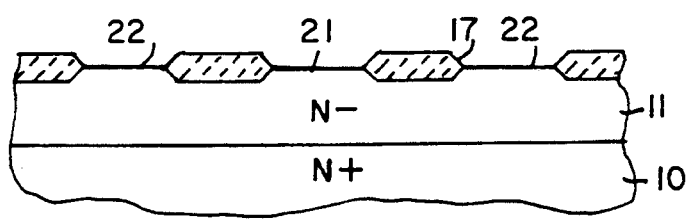

The wafer is then exposed to oxygen at an elevated temperature to grow a relatively thick silicon oxide layer 17 in the elongated areas between the elongated strips of silicon nitride 13, as illustrated in FIG. 3. The remaining silicon nitride layer 13 and the underlying silicon oxide layer 12 are removed by treating in suitable etching solutions. The resulting wafer as illustrated in FIG. 3 includes protective layers of thick silicon oxide 17 between exposed surface areas. The surface areas are alternately source surface areas 21 and gate surface areas 22.

Figure 4:
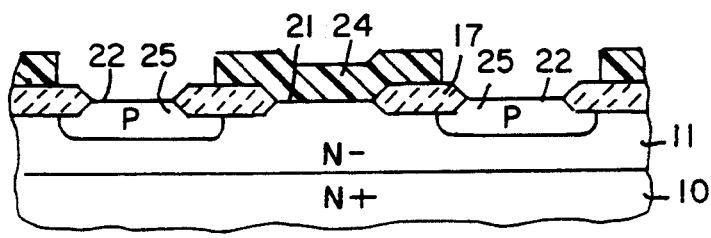

As illustrated in FIG. 4 the source surface areas 21 are protected with a layer of photoresist material 24 so that only the gate surface areas 22 remain exposed. P-type conductivity imparting material, for example boron, is then introduced into the wafer at the exposed gate surface areas 22 by conventional ion implantation techniques. The protective photoresist material 24 is removed, and the wafer is heated to cause the implanted P-type conductivity imparting material to diffuse into the epitaxial layer 11 from the gate surface areas 22. As a result of the ion implantation and subsequent heating, gate regions 25 of P-type conductivity are produced inset in the high resistivity N-type material of the epitaxial layer 11.

Figure 5:
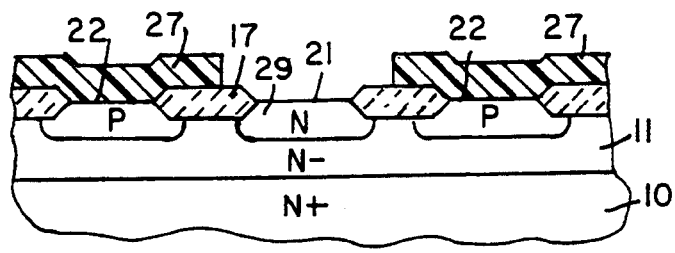

Next, the gate surface areas 22 are appropriately protected by photoresist material 27 (FIG. 5). In accordance with the present invention source regions are then formed by employing a two-step ion implantation process. First, a light dose of an N-type impurity such as phosphorous or arsenic is ion-implanted at high energy to produce first zones 29 at the source surface areas 21 as shown in FIG. 5. The energy is selected so as to place the N-type doping material at a maximum depth beneath the surface of from 2500 to 5000 angstroms. Specifically, phosphorous may be implanted at an energy level of 75 to 200 KeV at a dosage of 1E11 to 5E13 ions/cm$^2$.

Next, a second zone 30 (FIG. 6) is produced within each first zone 29 by ion-implanting a heavy dose of N-type doping material at low energy. Specifically, arsenic may be implanted at an energy level of from 35 to 65 KeV at a dosage of from 5E15 to 2E16 ions/cm$^2$. Each second zone 30 penetrates into its associated first zone 29 to a maximum depth beneath the surface 21 of from 100 to 800 angstroms.

In order to activate the doping impurities in both the first and second zones, after the photoresist material 27 is removed, the wafer is heated to raise its temperature from ambient to 1000° C. over a period of 30 minutes; heated at 1000° C. for from 10 to 30 minutes; and then cooled to 700° C. over a period of 60 minutes before being removed from the furnace. Following this treatment the wafer is subjected to a rapid thermal annealing cycle of 1100° C. for from 5 to 60 seconds.

Figure 6:
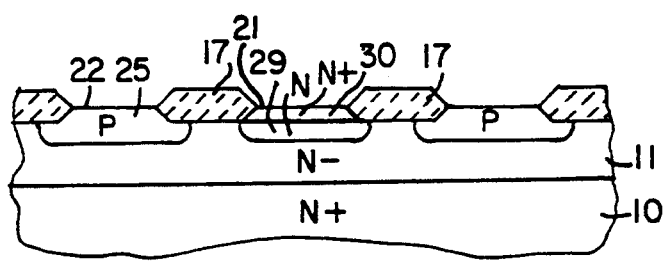

The device structure at this stage, as illustrated in FIG. 6, includes a source region at each source surface area 21 consisting of a second zone 30 having an impurity concentration greater than 5E20 ions/cm$^3$ and a remaining portion of a first zone 29 which lies interposed between the silicon of the epitaxial layer 11 and the second zone 30 which has an impurity concentration of from 4E15 to 1E17 ions/cm$^3$. Typically, the impurity concentration of the epitaxial layer 11 is 5E14 ions/cm$^3$.

Figure 7:
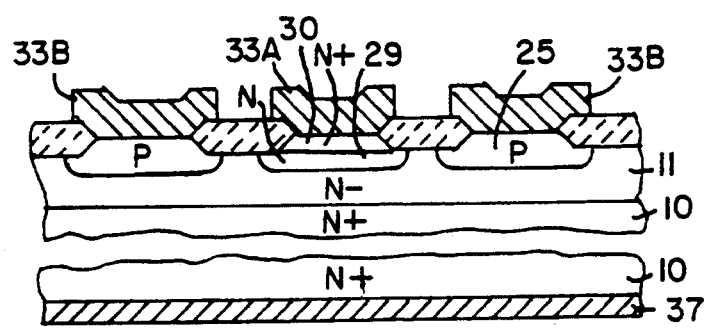

The wafer is then treated in accordance with known procedures to produce ohmic contact members to the source and gate regions as illustrated in FIG. 7. A layer of titanium-tungsten alloy (Ti/W) is deposited over the entire wafer followed by a layer of aluminum. Photoresist material is applied over the Ti/W-Al metallization and the photoresist material is removed except over the source and gate regions 30 and 25. The wafer is treated to etch away the exposed aluminum and then the underlying exposed titanium-tungsten alloy. The resulting source and gate contact members 33A and 33B as illustrated in FIG. 7 are in direct ohmic contact with the second zones of the source regions 29 and the gate regions 25 at the source and gate surface areas, respectively. The source contact members 33A are appropriately connected together and to a source bonding pad (not shown), and the gate contact members 33B are appropriately connected together and to a gate bonding pad (not shown) in a conventional manner. A metal layer 37 is applied to the bottom surface of the substrate 10 in order to provide a suitable drain contact member.

Figure 8:
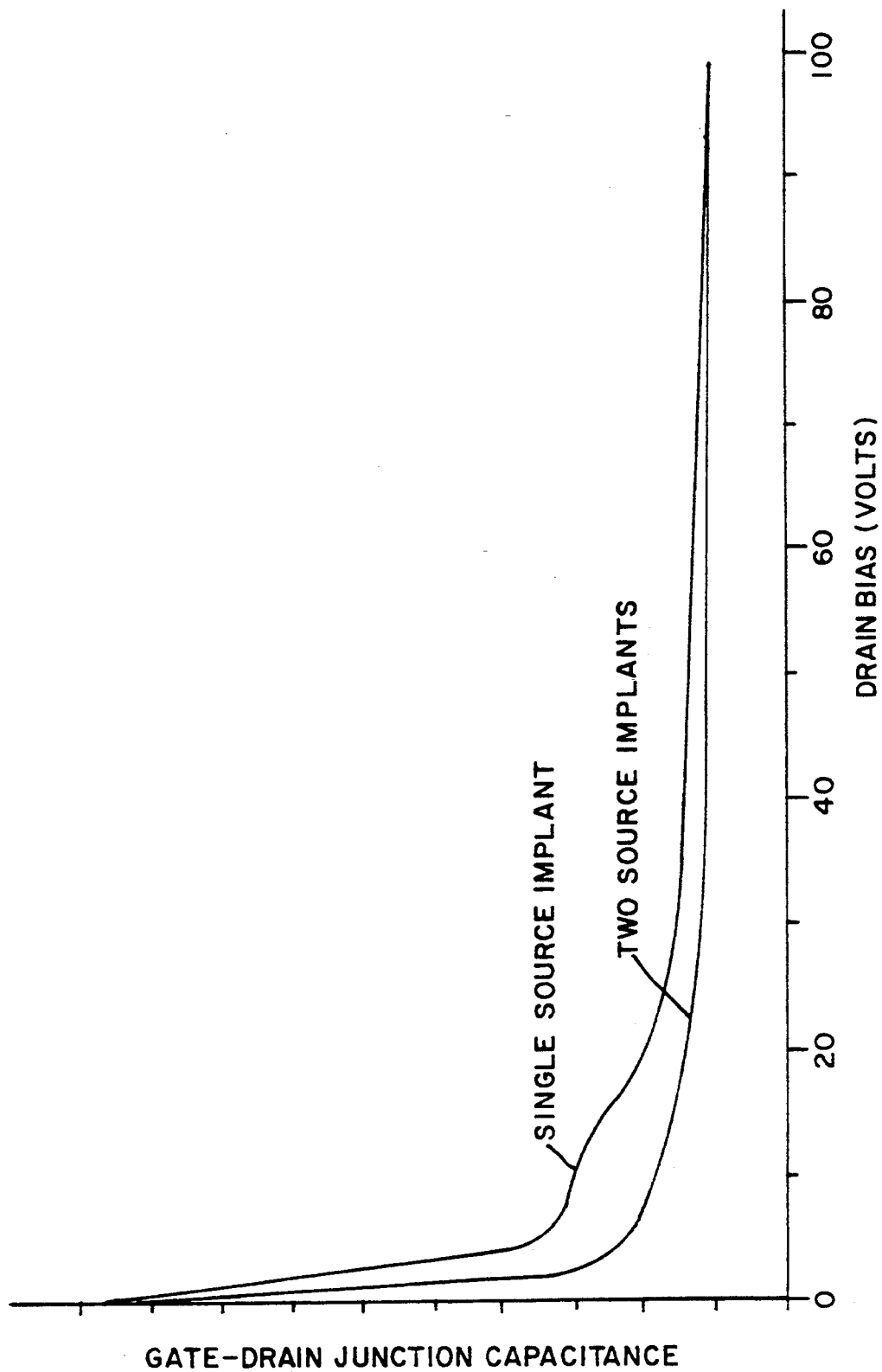
FIG. 8 illustrates the relationships of gate-drain junction capacitance with drain bias voltage for devices in accordance with the present invention and for prior art devices.

The light dose of N-type doping material introduced into the first zone to a greater depth than the conventional source region increases the impurity concentration in the silicon of the epitaxially grown layer only in a narrow portion of the device channel region where device pinch-off occurs. This change in impurity concentration reduces the gate-drain junction capacitance at lower drain voltages thereby improving device capacitance linearity. This improvement is illustrated by FIG. 8 which compares the gate-drain junction capacitance versus drain bias voltage of devices fabricated in accordance with the present invention with two source implants and devices prepared in accordance with the prior art with a single conventional ion implantation to form the source region. As can be seen from FIG. 8, with devices in accordance with the present invention the capacitance drops off at a much lower drain bias voltage and also stabilizes at a much lower drain bias voltage.

While there has been shown and described what is considered a preferred embodiment of the present invention, it will be obvious to those skilled in the art that various changes and modifications may be made therein without departing from the invention as defined by the appended claims.

What is claimed is:

1. A junction field effect transistor comprising
a body of semiconductor material including a substrate of semiconductor material of one conductivity type of relatively low resistivity and a layer of semiconductor material of the one conductivity type of relatively high resistivity contiguous with said substrate; said layer of semiconductor material having a surface coextensive with a surface of the body;
a layer of adherent, nonconductive, protective material adherent at said surface of said layer of semiconductor material, said layer of adherent, nonconductive, protective material having openings therein defining alternating source surface areas and gate surface areas at the surface of said layer of semiconductor material;
a gate region conductivity type the opposite of said one conductivity type inset in said layer of semiconductor material of the one conductivity type of relatively high resistivity at each of said gate surface areas;
a source region of the one conductivity type inset in said layer of semiconductor material of the one conductivity type of relatively high resistivity at each of said source surface areas, each source region being spaced from adjacent gate regions at said surface of said layer of semiconductor material of the one conductivity type of relatively high resistivity by interposed semiconductor material of said layer of semiconductor material of the one conductivity type of relatively high resistivity;
each of said source regions including a first zone of the one conductivity type inset in said layer of semiconductor material of the one conductivity type of relatively high resistivity, the resistivity of said first zone being lower than the resistivity of the semiconductor material of said layer of semiconductor material of the one conductivity type of relatively high resistivity interposed between adjacent gate and source regions; and a second zone of the one conductivity type of lower resistivity than said first zone inset in said first zone leaving a portion of said first zone interposed between said second zone and the semiconductor material of the layer of semiconductor material of the one conductivity type of relatively high resistivity;
a gate contact member in ohmic contact with each of said gate regions at said gate surface areas;
a source contact member in ohmic contact with the second zone of each of said source regions at said source surface areas; and
a drain contact member in ohmic contact with the semiconductor material of the substrate.
wherein
said first zone extend to a maximum depth beneath said surface of from 2500 to 5000 angstroms; and
said second zones extend to a maximum depth beneath said surface of from 100 to 800 angstroms.

2. A junction field effect transistor in accordance with claim 1 wherein
said semiconductor material is silicon.

3. A junction field effect transistor in accordance with claim 2 wherein
said first zones contain ion-implanted phosphorous or arsenic; and
said second zones contain ion-implanted arsenic.

* * * * *